US006448182B1

(12) United States Patent
Hall et al.

(10) Patent No.: US 6,448,182 B1
(45) Date of Patent: *Sep. 10, 2002

(54) STABILIZATION OF PEROXYGEN-CONTAINING SLURRIES USED IN A CHEMICAL MECHANICAL PLANARIZATION

(75) Inventors: Lindsey Hall, Dallas; Jennifer Sees, The Colony; Ashutosh Misra, Dallas, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/447,172

(22) Filed: Nov. 22, 1999

Related U.S. Application Data

(60) Provisional application No. 60/109,683, filed on Nov. 24, 1998.

(51) Int. Cl.[7] .................................... H01L 21/302
(52) U.S. Cl. .................. 438/692; 438/693; 252/79.1
(58) Field of Search ........................ 438/692, 693; 252/79.2, 79.1, 79.5; 216/89

(56) References Cited

U.S. PATENT DOCUMENTS

| | | | | |
|---|---|---|---|---|
| 4,550,074 A | * | 10/1985 | Tziniz et al. ............... | 430/322 |
| 5,648,448 A | * | 7/1997 | Marrocco, III et al. ..... | 528/125 |
| 5,783,489 A | * | 7/1998 | Kaufman et al. .......... | 438/692 |
| 5,980,775 A | * | 11/1999 | Grumbine et al. ......... | 252/79.1 |
| 6,001,269 A | * | 12/1999 | Sethuraman et al. ......... | 216/89 |
| 6,027,669 A | * | 2/2000 | Miura et al. ............. | 252/518.1 |
| 6,136,714 A | * | 10/2000 | Schutz ....................... | 438/692 |

OTHER PUBLICATIONS

Bare, John P., Johl, Budge. *Evaluation of Manufacturing Handling Characteristics of Hydrogen Peroxide–Based Tungsten CMP Slurry.* IEEE/CPMT Int'l Electronics Manufacturing Technology Symposium. Jan. 1998, pp. 164–171.

Malik, F., Hasan, M. *Manufacturability of the CMP process.* Elsevier Science S.A. Thin Solid Films 270 (1995) pp. 612–615.

Singer, Pete, ed. *Chemical–mechanical Polishing: A New Focus on Consumables.* Semiconductor International, Feb. 1994, pp. 48–52.

Fury, Michael A. *Emerging developments in CMP for semiconductor planarization.* Solid State Technology. Apr. 1995, pp. 47–54.

Fury, Michael A. *Emerging developments in CMP for semiconductor planarization*—Part 2. Solid State Technology. Jul. 1995, pp. 81–86.

Fury, Michael A. *The early days of CMP.* Solid State Technology. May 1997, pp. 81–86.

* cited by examiner

*Primary Examiner*—Benjamin L. Utech
*Assistant Examiner*—Kin-Chan Chen
(74) *Attorney, Agent, or Firm*—Mark A. Valetti; Wade James Brady, III; Frederick J. Telecky, Jr.

(57) ABSTRACT

An embodiment of the instant invention is a method of fabricating an electrical device having a structure overlying a semiconductor substrate which is planarized using chemical mechanical planarization, the method comprising the steps of: forming a layer of material over the semiconductor wafer; polishing the layer of material by subjecting it to a polishing pad and a slurry which includes peroxygen; and wherein the slurry additionally includes a stabilizing agent which retards the decomposition of the peroxygen in the slurry. Preferably, the stabilizing agent is comprised of: pyrophosphoric acids, polyphosphonic acids, polyphosphoric acids, Ethylenediamine Tetraacetic acid, a salt of the pyrophosphoric acids, a salt of the polyphosphonic acids, a salt of the polyphosphoric acids, a salt of the Ethylenediamine Tetraacetic acid and any combination thereof. In addition, the stabilizing agent may be comprised of: sodium pyrophosphate decahydrate, sodium pyrophosphate decahydrate, and/or 8-hydroxyquinoline. The decomposition of the peroxygen in the slurry is catalyzed by transition metals included in the slurry, and may be caused by the pH of the slurry. The layer of material is, preferably, comprised of: tungsten, copper, aluminum, a dielectric material, and any combination thereof.

11 Claims, 3 Drawing Sheets

US 6,448,182 B1

STABILIZATION OF PEROXYGEN-CONTAINING SLURRIES USED IN A CHEMICAL MECHANICAL PLANARIZATION

This application claims priority under 35 USC §119(e)(1) of provisional application No. 60/109,683 filed Nov. 24, 1998.

FIELD OF THE INVENTION

The instant invention pertains to semiconductor device fabrication and processing and more specifically to a method of stabilizing peroxygen-containing slurries in chemical mechanical planarization.

BACKGROUND OF THE INVENTION

Two trends present in the semiconductor device manufacturing arena involve the desire to have planar structures and reducing contamination of structures overlying the semiconductor substrate. Chemical-mechanical polishing (CMP) is being utilized with greater and greater frequency to achieve both of these trends. Most semiconductor manufacturers use CMP to planarize dielectric layers and to planarize some metal structures. The most common approach used in the CMP process is to attach a semiconductor wafer to a carrier (which may or may not rotate) via a mounting pad and polishing the exposed surface of the wafer by bringing it into contact with a polishing pad (which is mounted on a rotating or non-rotating platen). The mechanical abrasion between the wafer surface and the polishing pad results in the polishing of the wafer surface. To aid in the polishing and the removal of any particles liberated in this process, a slurry is usually introduced between the wafer surface and the polishing pad. The chemical components of the slurry will react with the wafer surface, thereby making the wafer more easily polishable, and the excess slurry will carry away the materials liberated from the wafer during this polishing step.

Most processes used in the semiconductor industry, today, involve the formation of a layer of either conductive or insulating material by the planarization (typically CMP) of the material. For example, a dielectric layer, which is quite thick in comparison to other structures, is typically deposited over the entire wafer. Due to the underlying topology, the upper surface of this layer varies in height by a fairly appreciable amount. Using present lithography methods and equipment, the via holes/trenches that are to be patterned in this layer to form the conductive interconnects, are difficult to fabricate because of the variance in the height of this upper surface. Hence, a planarization step is required prior to the patterning of these holes. This step is, typically, accomplished by CMP, which results in a relatively planar upper surface of the dielectric layer.

In addition, CMP can be utilized after the blanket formation of a conductive material (such as tungsten, copper, aluminum, or other metal/combination of metals) so as to form inlaid conductive structures such as vias and/or interconnects. The use of CMP, as opposed to, for example, reactive ion etch ("RIE"), is both cleaner and results in a more planar structure. Typically, metallization schemes are formed using CMP by first forming the openings in a dielectric layer for the vias and/or interconnects and then blanketly (or selectively) forming the conductive material so as to fill up the vias and/or interconnect openings. In order to properly fill these openings, an excess amount of the conductor is preferably deposited over the wafer. This results in the formation of a layer of conductive material over the dielectric layer in regions other than the openings. In order to remove this excess material, a CMP process is performed.

In some metallization schemes, the efficiency of the removal of the excess conductive material (or dielectric material) may be enhanced by introducing an oxidant to the CMP process so that a portion of the material to be removed becomes at least partially oxidized. The reason for this is that some oxidized materials are softer, and therefore more easily removed than the material itself. Furthermore, the oxidation of the top layer prevents the bulk of the material from getting oxidized and therefore control over planarization is made possible. For example, tungsten oxide is softer and more easily removed than tungsten. Hence, some semiconductor device manufacturers add hydrogen peroxide or other oxidizing agents to the slurry when polishing tungsten so as to cause the oxidation of portions (usually the peaks of the tungsten, structure) of the tungsten thereby making these portions easier to remove. The peroxide may be added to the slurry prior to its use to polish the layer of material to be removed or it may be added separately onto the pad. However it is preferable to mix the hydrogen peroxide into the slurry, in a ratio of around 1 to 10 percent by weight, prior to the delivery of the slurry to the CMP tool because of increased control and operational simplicity. See John P. Bare & Budge Johl, Evaluation of Manufacturing Handling Characteristics of Hydrogen Peroxide-Based Tungsten CMP Slurry, *IEEE/CPMT INTERNATIONAL ELECTRONICS MANUFACTURING TECHNOLOGY SYMPOSIUM* 164–171 (1998) However, there is problem with this method. Peroxygen-containing slurries have a short pot life. A common observation in the industry is that hydrogen peroxide-containing slurries decompose at a rate of around 0.1 wt % per day in a static bath which means that the slurry becomes less effective each day. Curve 102 of FIG. 1 illustrates the decomposition of hydrogen peroxide in a typical commercially available tungsten polish slurry. The result of this decomposition of the hydrogen peroxide is that the removal rate of the CMP process which uses this slurry diminishes at a rate which is not completely predictable. Ultimately, the removal rate will become so low that the slurry will no longer be usable and should be discarded.

This decomposition phenomena may be attributed to several different reasons. UV radiation impinging upon the slurry, elevated temperatures, and the high-pH of some slurries have been recognized by many in the industry as the major factors controlling the decomposition of hydrogen peroxide mixed into the slurry. However, the inventors of the instant application discovered that the presence of transition metals in the slurry can be the controlling cause of the decomposition of the peroxide in the slurry. The transition metals in the slurry will rapidly catalyze the decomposition of hydrogen peroxide, thereby forming water and oxygen as the by products.

SUMMARY OF THE INVENTION

An embodiment of the instant invention is a method of fabricating an electrical device having a structure overlying a semiconductor substrate which is planarized using chemical mechanical planarization, the method comprising the steps of: forming a layer of material over the semiconductor wafer; polishing the layer of material by subjecting it to a polishing pad and a slurry which includes peroxygen; and wherein the slurry additionally includes a stabilizing agent which retards the decomposition of the peroxygen in the slurry. Preferably, the stabilizing agent is comprised of:

pyrophosphoric acids, polyphosphonic acids, polyphosphoric acids, Ethylenediamine Tetraacetic acid, a salt of the pyrophosphoric acids, a salt of the polyphosphonic acids, a salt of the polyphosphoric acids, a salt of the Ethylenediamine Tetraacetic acid and any combination thereof. In addition, the stabilizing agent may be comprised of: sodium pyrophosphate decahydrate, sodium pyrophosphate decahydrate, and/or 8-hydroxyquinoline. The decomposition of the peroxygen in the slurry is catalyzed by transition metals included in the slurry, and may be caused by the pH of the slurry. The layer of material is, preferably, comprised of: tungsten, copper, aluminum, a dielectric material, and any combination thereof.

Another embodiment of the instant invention is a method of chemical-mechanical polishing a layer situated over a semiconductor substrate, the method comprising the steps of: mixing a peroxygen-containing substance and a stabilizing agent with a slurry to create a slurry mixture; storing the slurry mixture for a period of time; using the slurry mixture with a chemical-mechanical polishing apparatus to planarize the layer situated over the semiconductor substrate; and wherein the stabilizing agent is comprised of a chemical selected from the group consisting of: sodium pyrophosphate decahydrate; pyrophosphoric acids, polyphosphonic acids, polyphosphoric acids, Ethylenediamine Tetraacetic acid, a salt of the pyrophosphoric acids, a salt of the polyphosphonic acids, a salt of the polyphosphoric acids, a salt of the Ethylenediamine Tetraacetic acid; 8-hydroxyquinoline and any combination thereof. Preferably, the stabilizing agent further comprises sodium pyrophosphate decahydrate.

DETAILED DESCRIPTION OF THE DRAWINGS

While the following description of the instant is described with reference to a tungsten CMP process which utilizes hydrogen peroxide, the instant invention can be utilized in any CMP process where a peroxygen-containing slurry is used. For example, a conductive material may be removed other than tungsten. In fact, the material removed may be a dielectric material instead of a conductive material. In addition, any stabilizing agent may be used so long as it has the following properties: (1) it has the ability to bind transition metals (including, but not limited to, elements such as Fe, Cu, Co, Mn, Ni and Cr) in an aqueous or organic medium; (2) it is substantially free of transition metal contamination; (3) it is soluble in the peroxygen containing slurry mixture (4) the stabilizing agent does not retard the polish rate of the layer being polished by the CMP process; (5) it does not cause significant change in size of abrasive particles used in the CMP slurry. Examples of these include: pyrophosphoric acids, polyphosphonic acids, polyphosphoric acids, Ethylenediamine Tetraacetic Acid (EDTA), salts of the above-mentioned acids, a combination of the above-mentioned acids and salts of the above-mentioned acids and hydroxyquinoline. Furthermore, the slurry may be comprised of any type of slurry in which transition metals are present as contaminants.

Figure 1:
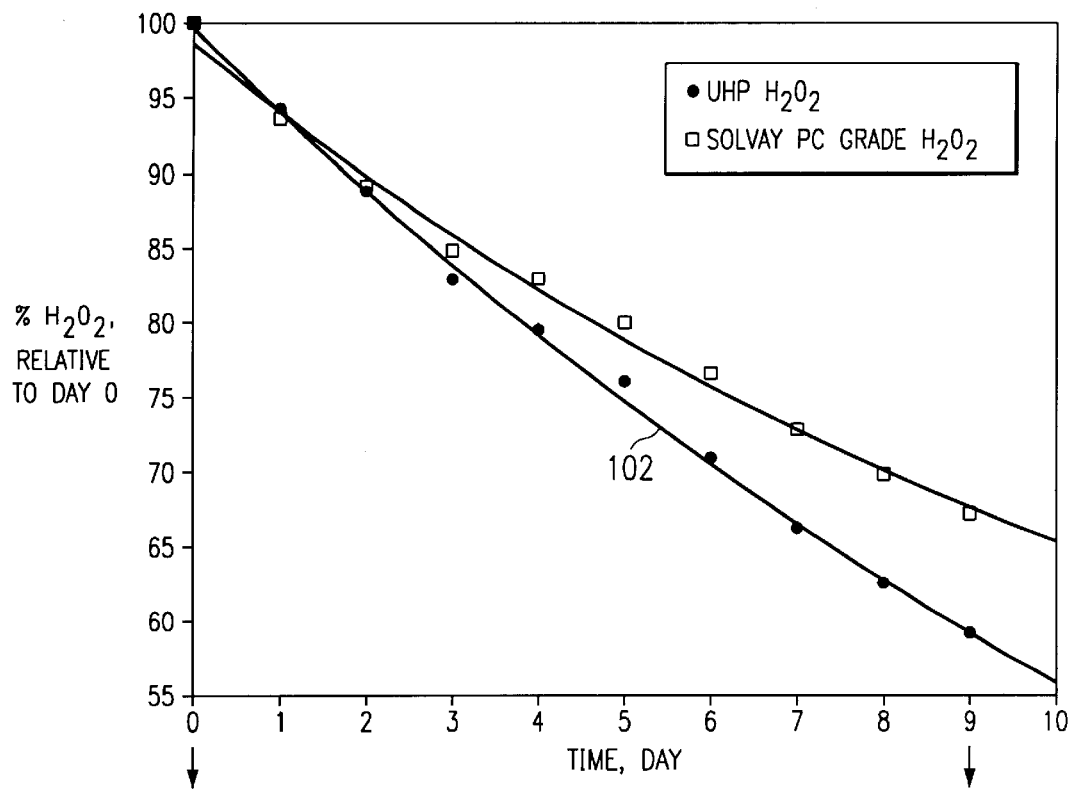
FIG. 1 is a graph illustrating the decomposition of hydrogen peroxide, which is mixed with W2000 slurry as an oxidizing agent, over time.

The following figures illustrate the concentration of hydrogen peroxide in a slurry developed by Cabot Corporation (referred to as "W2000") used to polish a tungsten-containing layer. Referring to FIG. 1, curve 102 illustrates the decomposition of unstabilized hydrogen peroxide incorporated in the W2000 slurry. As FIG. 1 illustrates, the concentration of the hydrogen peroxide nine days after the hydrogen peroxide was incorporated into the W2000 slurry is around 60% of what it was when it was originally mixed.

Figure 2:
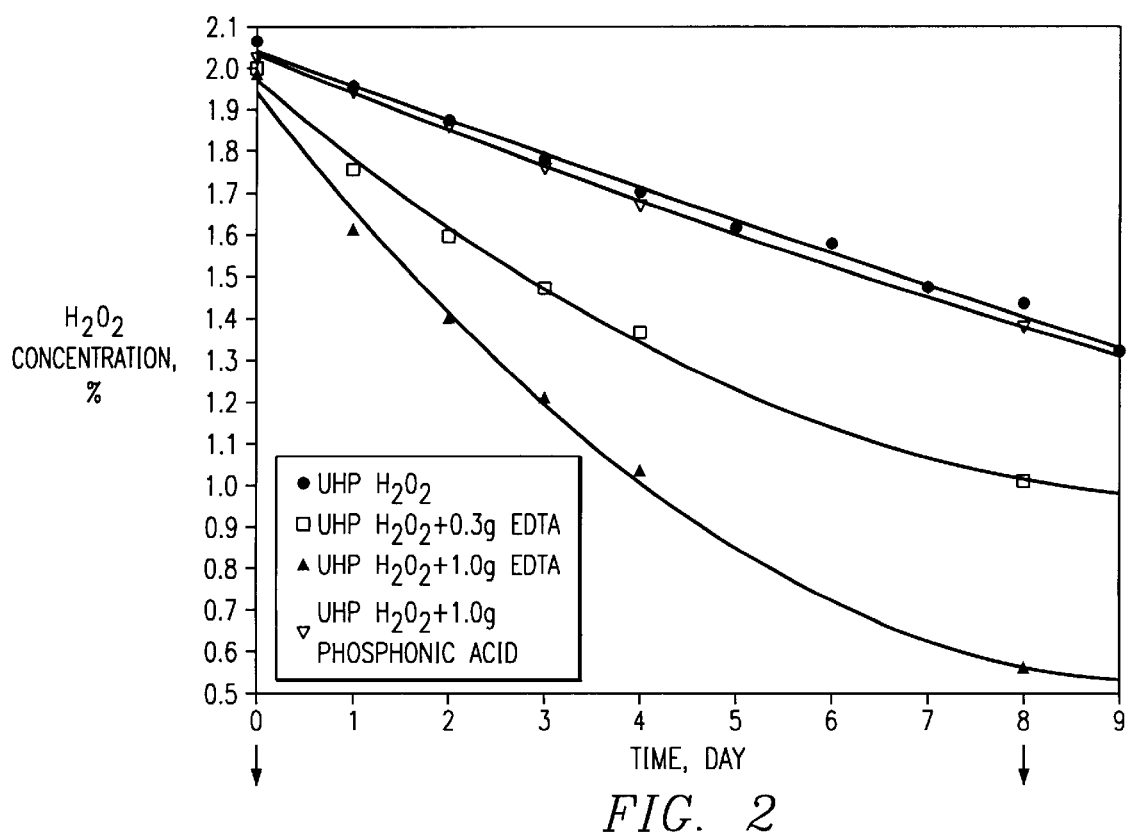
FIG. 2 is a graph illustrating the concentration of hydrogen peroxide in W2000 slurry with stabilization agents of one embodiment of the instant invention.
Figure 3:
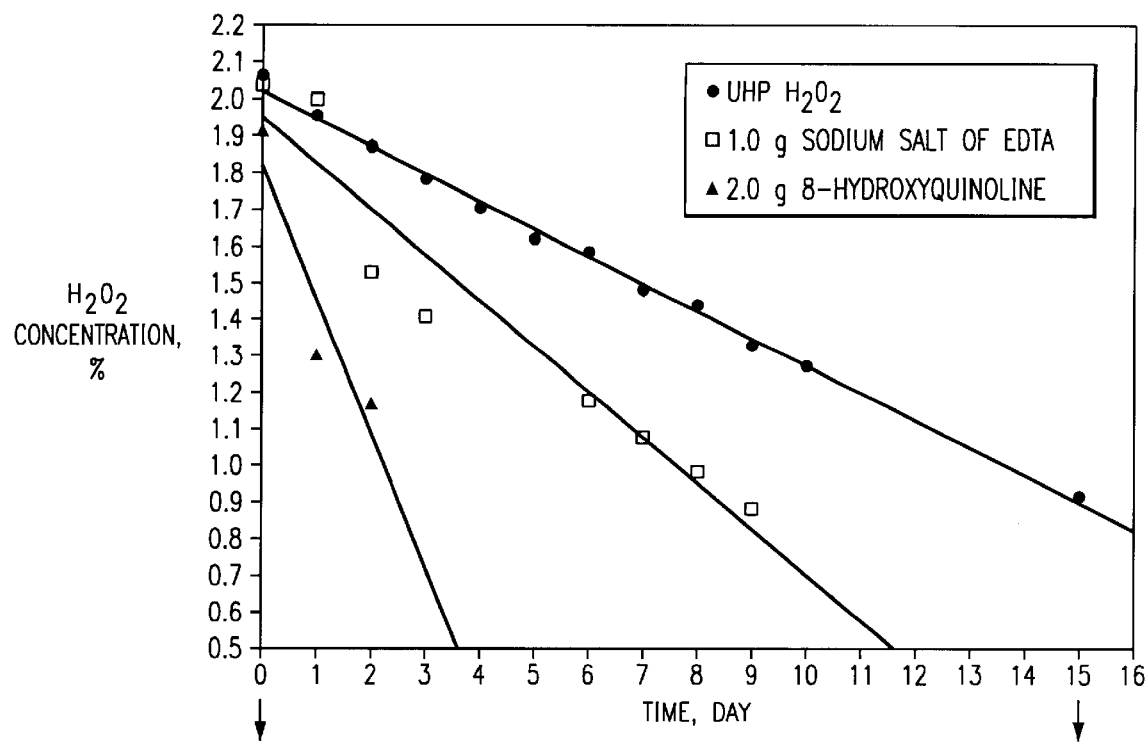
FIG. 3 is a graph illustrating the concentration of hydrogen peroxide in W2000 slurry with stabilization agents of another embodiment of the instant invention.

FIGS. 2 and 3 illustrate that various chelating agents, such as EDTA, the salts from EDTA, phosphonic acid, and hydroxyquinoline, do not necessarily provide the stabilization that is required. In fact, each of the chelating agents tested resulted in an enhanced decomposition of the hydrogen peroxide. However, one or more of these chelating agents (alone or in combination with each other or another chemical) may provide the proper stabilization if: it is used in a different amount, it is purified so as to remove any contaminants such as transition metals, it is used with a different slurry or it is combined with another chemical (which may or may not be a stabilization agent by itself). One of ordinary skill in the art should be able to arrive at such mixtures or amounts based on the teachings of the instant specification without any undue experimentation.

Figure 4:
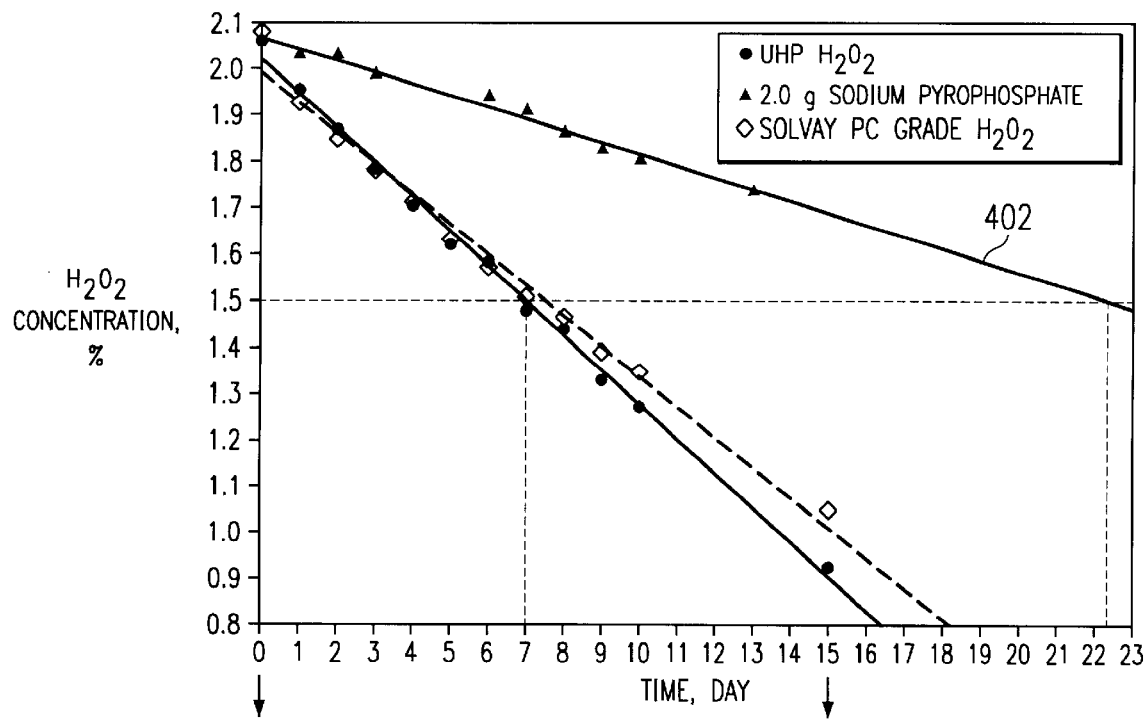
FIG. 4 is a graph illustrating the concentration of hydrogen peroxide in W2000 slurry with stabilization agents of one preferred embodiment of the instant invention.

FIG. 4 illustrates the stabilization scheme (illustrated as plot 402) of one preferred embodiment of the instant invention where the original concentration of the hydrogen peroxide is preferably around two percent by weight of the combination of the hydrogen peroxide with the W2000 slurry. In this embodiment, the stabilization agent is preferably around two grams of sodium pyrophosphate per 2000 g of the slurry mixture and the lower limit of hydrogen concentration is around 1.5% due to the dynamics of the particular tungsten CMP process used. The amount of sodium pyrophosphate may be varied so as to provide better stabilization. If a different slurry is used, more or less of the stabilization agent (or even a different stabilization agent) may be preferable.

Figure 5:
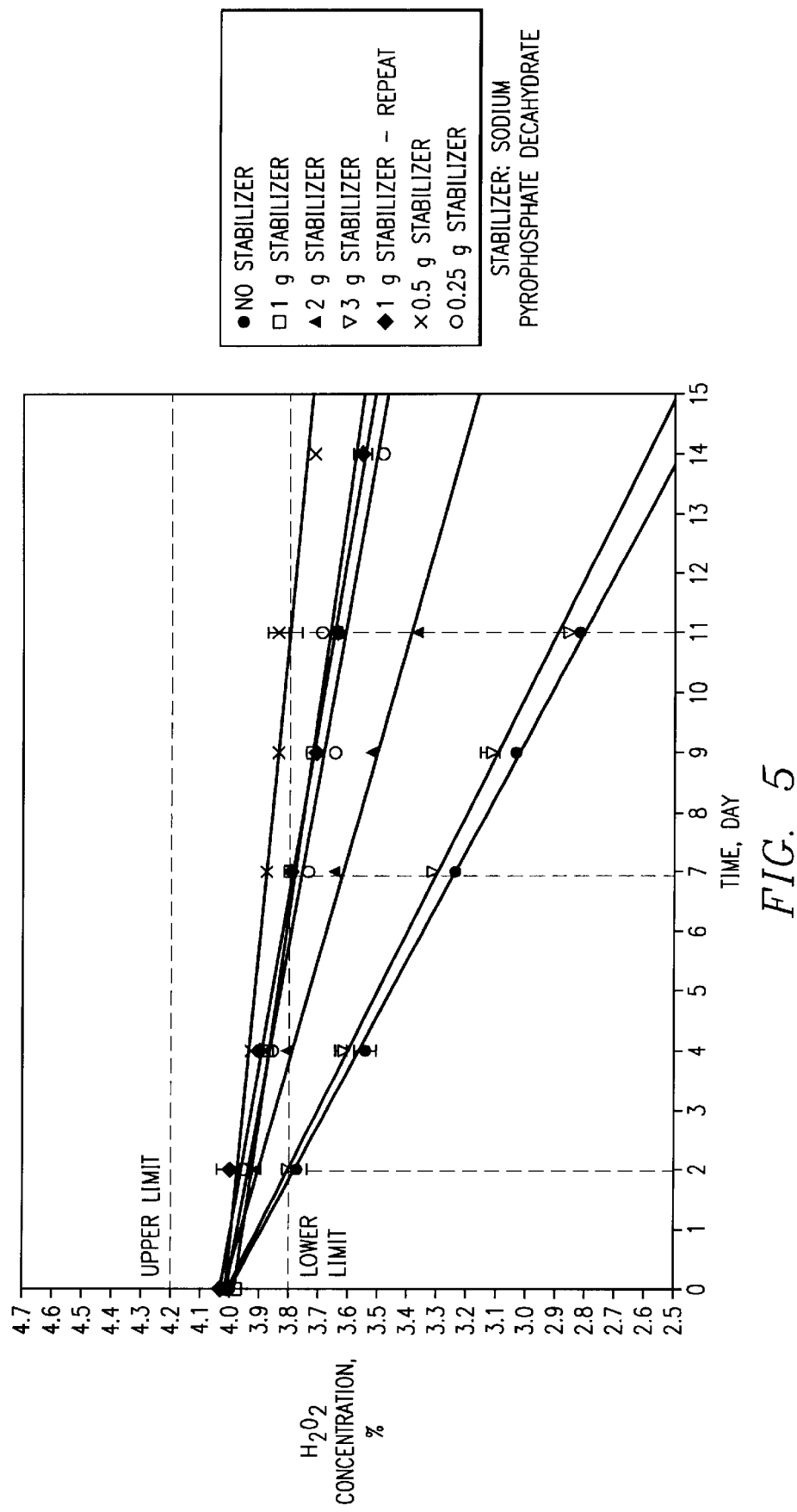
FIG. 5 is a graph illustrating the concentration of hydrogen peroxide in-W2000 slurry with stabilization agents of another preferred embodiment of the instant invention.

FIG. 5 illustrates several stabilization schemes of another preferred embodiment of the instant invention where the original concentration of the hydrogen peroxide is preferably around 4 percent by weight of the combination of the hydrogen peroxide with the W2000 slurry. In this embodiment, the stabilization agent is preferably around between 0.25 and 3 grams (more preferably around 0.25 to 1 gram—even more preferably around 0.5 grams) of sodium pyrophosphate per 1000 g of the slurry and the lower limit of hydrogen concentration is around 3.8% due to the dynamics of the particular tungsten CMP process used. The amount of sodium pyrophosphate may be varied so as to provide better stabilization. If a different slurry is used, more or less of the stabilization agent (or even a different stabilization agent) may be preferable.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating an electrical device having a structure overlying a semiconductor substrate which is planarized using chemical mechanical polishing, said method comprising the steps of:

provic a semiconductor wafer;

forming a layer of material over said semiconductor wafer;

polishing said layer of material by subjecting it to a polishing pad and a slurry which includes a mixture of a peroxygen and a transition metal; and stabilizing said slurry with a stabilizing agent selected from the group consisting of sodium pyrophosphate decahydrate, pyrophosphoric acids, a salt of said pyrophosphoric acids and any combination thereof, wherein the stabilizing agent retards the decomposition of the peroxygen in the slurry containing said transition metal.

2. The method of claim 1, wherein said stabilizing agent is comprised of a chemical selected from the group consisting of: pyrophosphoric acids, polyphosphonic acids, polyphosphoric acids, Ethylenediamine Tetraacetic acid, a salt of said pyrophosphoric acids, a salt of said polyphosphonic acids, a salt of said polyphosphoric acids, a salt of said Ethylenediamine Tetraacetic acid and any combination thereof.

3. The method of claim 1, wherein said stabilizing agent is comprised of 8-hydroxyquinoline.

4. The method of claim 1, wherein said decomposition of said peroxygen in said slurry is affected by the pH of said slurry.

5. The method of claim 1, wherein said layer of material is comprised of a material selected from the group consisting of: tungsten, copper, aluminum, a dielectric material, and any combination thereof.

6. The method according to claim 1, wherein said stabilizing agent is present in an amount of 0.25 to 1 gram per 1000 grams of said slurry.

7. A method of fabricating an electrical device having a structure overlying a semiconductor substrate which is planarized using chemical mechanical polishing, said method comprising the steps of:

providing a semiconductor wafer;

forming a layer of material over said semiconductor wafer;

polishing said layer of material by subjecting it to a polishing pad and a slurry which includes a mixture of a peroxygen and a transition metal; and stabilizing said slurry with a stabilizing agent comprising sodium pyrophosphate decahydrate, wherein the stabilizing agent retards the decomposition of the peroxygen in the slurry containing said transition metal.

8. A method of fabricating an electrical device having a structure overlying a semiconductor substrate which is planarized using chemical mechanical polishing, said method comprising the steps of:

providing a semiconductor wafer;

forming a layer of material over said semiconductor wafer;

polishing said layer of material by subjecting it to a polishing pad and a slurry which includes a mixture of a peroxygen and a transition metal; and stabilizing said slurry with a stabilizing agent comprised of a chemical selected from the group consisting of: pyrophosphoric acids, polyphosphonic acids, polyphosphoric acids, Ethylenediamine Tetraacetic acid, a salt of said pyrophosphoric acids, a salt of said polyphosphonic acids, a salt of said polyphosphoric acids, a salt of said Ethylenediamine Tetraacetic acid and any combination thereof, wherein said stabilizing agent further comprises sodium pyrophosphate decahydrate, wherein the stabilizing agent retards the decomposition of the peroxygen in the slurry containing said transition metal.

9. A method of chemical-mechanical polishing a layer situated over a semiconductor substrate, said method comprising the steps of:

mixing a peroxygen-containing substance and a stabilizing agent with a slurry to create a slurry mixture containing a transition metal;

storing said slurry mixture for a period of time; and using said slurry mixture with a chemical-mechanical polishing apparatus to planarize said layer situated over said semiconductor substrate;

said stabilizing agent having the ability to retard the decomposition of said peroxygen-containing substance in said slurry and being comprised of a chemical selected from the group consisting of: sodium pyrophosphate decahydrate, pyrophosphoric acids, a salt of said pyrophosphoric acids and any combination thereof.

10. A method of chemical-mechanical polishing a layer situated over a semiconductor substrate, said method comprising the steps of:

mixing a peroxygen-containing substance and a stabilizing agent with a slurry to create a slurry mixture containing a transition metal;

storing said slurry mixture for a period of time; and using said slurry mixture with a chemical-mechanical polishing apparatus to planarize said layer situated over said semiconductor substrate;

said stabilizing agent having the ability to retard the decomposition of said peroxygen-containing substance in said slurry and being comprised of sodium pyrophosphate decahydrate.

11. The method according to claim 9, wherein said stabilizing agent is present in an amount of 0.25 to 1 gram per 1000 grams of said slurry.

* * * * *